United States Patent
Kang et al.

(10) Patent No.: US 8,502,932 B2
(45) Date of Patent: Aug. 6, 2013

(54) LIQUID CRYSTAL DISPLAY DEVICE AND MANUFACTURING AND REPAIRING METHODS THEREOF

(75) Inventors: Dong Chun Kang, Gwangju (KR); Dae Young Seok, Daegu (KR); Mon Soo Kang, Daegu (KR); Jae Ho Yoon, Gyeongbuk (KR); Hyun Jeong Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 170 days.

(21) Appl. No.: 12/862,021

(22) Filed: Aug. 24, 2010

(65) Prior Publication Data
US 2011/0037934 A1 Feb. 17, 2011

(30) Foreign Application Priority Data
Dec. 8, 2009 (KR) .......... 10-2009-0121256

(51) Int. Cl.
G02F 1/1343 (2006.01)
(52) U.S. Cl.
USPC ........................... 349/54; 349/143
(58) Field of Classification Search
None
See application file for complete search history.

(56) References Cited

U.S. PATENT DOCUMENTS

| | | | | |
|---|---|---|---|---|
| 6,403,980 B1 * | 6/2002 | Park | | 257/59 |
| 2002/0149020 A1 * | 10/2002 | Jung et al. | | 257/72 |
| 2004/0125300 A1 * | 7/2004 | Lee | | 349/141 |
| 2005/0231672 A1 * | 10/2005 | Liu et al. | | 349/139 |
| 2005/0270435 A1 * | 12/2005 | Shiau et al. | | 349/54 |
| 2006/0077313 A1 * | 4/2006 | Liu et al. | | 349/55 |
| 2007/0045625 A1 * | 3/2007 | Chen et al. | | 257/59 |
| 2008/0117349 A1 * | 5/2008 | Chang et al. | | 349/55 |
| 2008/0135857 A1 * | 6/2008 | Kim et al. | | 257/88 |
| 2009/0152552 A1 * | 6/2009 | Ku | | 257/59 |
| 2011/0043741 A1 * | 2/2011 | Hirato | | 349/143 |

FOREIGN PATENT DOCUMENTS

| | | | |
|---|---|---|---|
| JP | 2005-164746 A | * | 6/2005 |
| KR | 10-2001-0100378 | | 11/2001 |
| KR | 10-2006-0012435 | | 2/2006 |
| KR | 10-2008-0056830 | | 3/2008 |
| WO | WO 2009/130908 A1 | * | 10/2009 |

* cited by examiner

Primary Examiner — Mike Stahl
(74) Attorney, Agent, or Firm — McKenna Long & Aldridge LLP

(57) ABSTRACT

An LCD device is disclosed. The LCD device includes: a gate line and a gate electrode formed on a substrate; a common line formed in the same layer as the gate line; a gate insulation film entirely formed on the substrate with the gate line; a data line formed on the gate insulation film opposite to the common line and configured to cross with the gate line and to define a pixel region; a source electrode formed to protrude from the data line; a drain electrode separated by a first distance from the source electrode; a passivation film entirely formed on the substrate with the data line; and a pixel electrode formed on the passivation film and connected to the drain electrode. The common line includes first and second common lines separated by a second distance from each other, and a third common line formed within the second distance between the first and second common lines and used as a repair pattern during a repairing process.

5 Claims, 11 Drawing Sheets

LIQUID CRYSTAL DISPLAY DEVICE AND MANUFACTURING AND REPAIRING METHODS THEREOF

CROSS-REFERENCE TO RELATED APPLICATION

This application claims priority under 35 U.S.C. 119 to Korean Patent Application No. 10-2009-0121256, filed on Dec. 8, 2009, which is hereby incorporated by reference in its entirety.

BACKGROUND OF THE INVENTION

1. Field of the Disclosure

This disclosure relates to a liquid crystal display (LCD) device, as well as manufacturing and repairing methods thereof.

2. Description of the Related Art

In general, LCD devices are based on a driving principle employing optical isotropic and polarization properties of the liquid crystal. The liquid crystal molecules are directionally aligned due to their thin and long shape. Also, the molecular alignment of the liquid crystal can be artificially controlled in direction by means of an electric field applied to the liquid crystal.

If the direction of the liquid crystal molecular alignment is arbitrarily adjusted, a light refractive index of the liquid crystal is varied along the changed direction of the molecular alignment due the optical isotropic property of the liquid crystal. As such, the amount of light passing through the liquid crystal is controlled. Therefore, a variety of images can be displayed by an LCD device.

The LCD devices, as described above, include active matrix LCD devices each configured to include thin film transistors and pixel electrodes which are connected to each other and arranged in a matrix shape. The active matrix LCD devices are now being most heavily highlighted, because of their features, such as, high definition and superior display capability for motion picture images.

FIG. 1 is a disassembled perspective view schematically showing an ordinary LCD device. Referring to FIG. 1, the ordinary LCD device 11 includes: an upper substrate 8 configured to include a common electrode 5 formed on a color filter layer which includes a black matrix 6 and sub-color filters 7; and a lower substrate 10 configured to include pixel electrodes 18 each formed in pixel regions P, thin film transistors T used as a switching element, and gate and data lines 16 and 17. A liquid crystal material 30 is filled between the upper and lower substrates 8 and 10.

The lower substrate 10 is called a thin film transistor substrate. The thin film transistors T, which are used as a switching element, are arranged in a matrix shape. More specifically, the thin film transistors T are formed at the intersections of the gate and data lines 16 and 17. The pixel regions P are defined by the gate and data lines 16 and 17 crossing each other.

The gate lines 16 are used to transfer driving pulse voltages to the gate electrodes of the respective thin film transistors T. The data lines 17 are used to transfer signal voltages to source electrodes of the respective thin film transistors T. Also, each of the thin film transistors T is activated by the pulse voltage on its gate electrode and applies the signal voltage on its source electrode to the respective pixel electrode 18. A pixel is driven when a signal voltage corresponding to a liquid crystal driving voltage is applied to its pixel electrode 18 and a lower voltage than the liquid crystal driving voltage is charged into the common electrode 5.

In this manner, the gate lines 16 and the data lines 17 are arranged in a matrix shape on the entire surface of the lower substrate 10, in order to independently drive the plurality of pixel electrodes 18. Such gate and data lines 16 and 17 are used for directly driving the thin film transistors T which correspond to a switching element.

However, defects can be caused in the array substrates with the above components by a variety of factors while the array substrates are manufactured. The defects include a dot defect, a line defect, an abnormally displayed stain, and so on. The dot defect can be caused by a damaged thin film transistor T or pixel electrode 18. The line defect can be caused by a broken line, a short circuit of lines, a damaged thin film transistor T, and others. The damage of the thin film transistor T can be generated by static electricity.

Such defects are dealt with as a more important matter as the display screens of image devices are enlarged. Actually, an image device with only one damaged line can not be dealt with in a valuable product. For example, if any one of the gate and data lines is shortened with another adjacent line, all the thin film transistors T connected to the shortened line are not driven. This defect generated in the array substrate seriously affects the LCD device. Therefore, it must be necessary to repair the damaged lines, in order to prevent the deterioration of a production rate.

On the other hand, the LCD device is recently manufactured in the structure that common lines formed in the same layer as gate lines are recently arranged under data lines, in order to improve an aperture ratio. The common lines are used to shield light leakage domains which can be generated around the data lines.

When the LCD device with the above structure is manufactured, the common and data lines can be shortened with each other through a gate insulation film, which is formed therebetween, due to their material properties or foreign substances. Due to this, all the thin film transistors connected the shortened data line can be not driven, and furthermore the pixel regions can be entirely damaged.

SUMMARY OF THE INVENTION

Accordingly, the present embodiments are directed to an LCD device that substantially obviates one or more of problems due to the limitations and disadvantages of the related art, and manufacturing and repairing methods thereof.

An object of the present disclosure is to provide an LCD device that is adapted to include a repair pattern and to prevent pixel regions from being entirely damaged by a short circuit between data and common lines, as well as manufacturing and repairing methods thereof.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, an LCD device includes: a gate line and a gate electrode formed on a substrate; a common line formed in the same layer as the gate line; a gate insulation film entirely formed on the substrate with the gate line; a data line formed on the gate insulation film opposite to the common line and configured to cross with the gate line and to define a pixel region; a source electrode formed to protrude from the data line; a drain electrode separated by a first distance from the source electrode; a passivation film entirely formed on the substrate with the data line; and a pixel electrode formed on the passivation film and connected to the drain electrode. The common line includes first and second common lines separated by a second distance from each other, and a third common line formed within the second distance between the first and second common lines and used as a repair pattern during a repairing process.

The common line can be formed in a wider width than that of the data line and exposed outwardly from both sides of the data line.

The third common line is formed in a bar shape, which is configured to cross with the data line, and connected to the first and second common lines.

A method of manufacturing an LCD device according to another general aspect of the present embodiment, includes: forming gate line, a gate electrode, and first through third common lines on a substrate; forming a gate insulation film on the entire surface of the substrate with the gate line; forming a semiconductor pattern, source/drain electrodes, and a data line formed on the gate insulation film on the gate insulation film; forming a passivation film on the substrate with the source/drain electrodes; patterning the passivation film to form a contact hole exposing the drain electrode; and forming a pixel electrode, which is electrically connected to the drain electrode, on the passivation film.

The first and second common lines is formed in such a manner as to be separated by a second distance from each other, and the third common line is formed within an interval between the first and second common lines, as a repair pattern to be used during a repairing process.

The common line can be formed in a wider width than that of the data line and exposed outwardly from both sides of the data line.

The third common line is formed in a bar shape, which is configured to cross with the data line, and connected to the first and second common lines.

A repairing method according to still another general aspect of the present embodiment is applied to an LCD device including: a gate line, and a gate electrode formed on a substrate; a common line formed in the same layer as the gate line and configured to include first and second common lines, which are separated by a second distance from each other, and a third common line which is formed within the second distance between the first and second common lines and used as a repair pattern during a repairing process; a gate insulation film entirely formed on the substrate with the gate line; a data line formed on the gate insulation film opposite to the common line and configured to cross with the gate line and to define a pixel region; a source electrode formed to protrude from the data line; a drain electrode separated by a first distance from the source electrode; a passivation film entirely formed on the substrate with the data line; and a pixel electrode formed on the passivation film and connected to the drain electrode. The repairing method includes irradiating a laser beam at the stacked gate insulation and passivation films opposite to both ends of the third common line to cut off the third common line from the first and second common lines.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION OF THE ILLUSTRATED EMBODIMENTS

Figure 1:
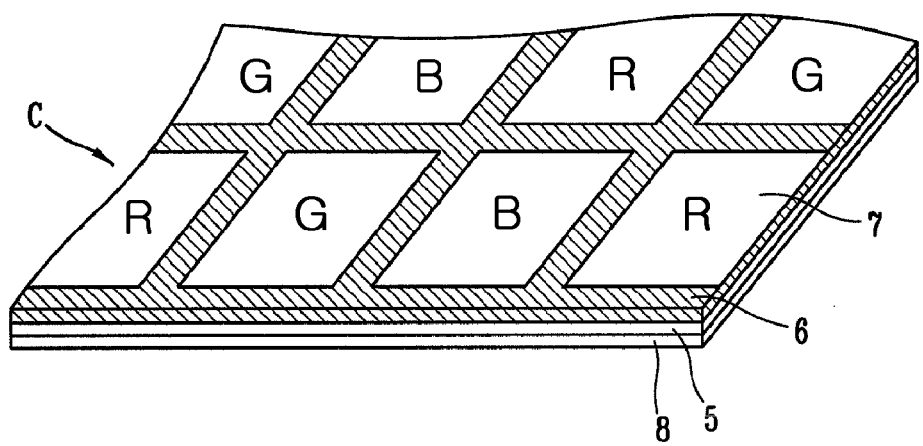
FIG. 1 is a disassembled perspective view schematically showing an ordinary LCD device.
Figure 1:
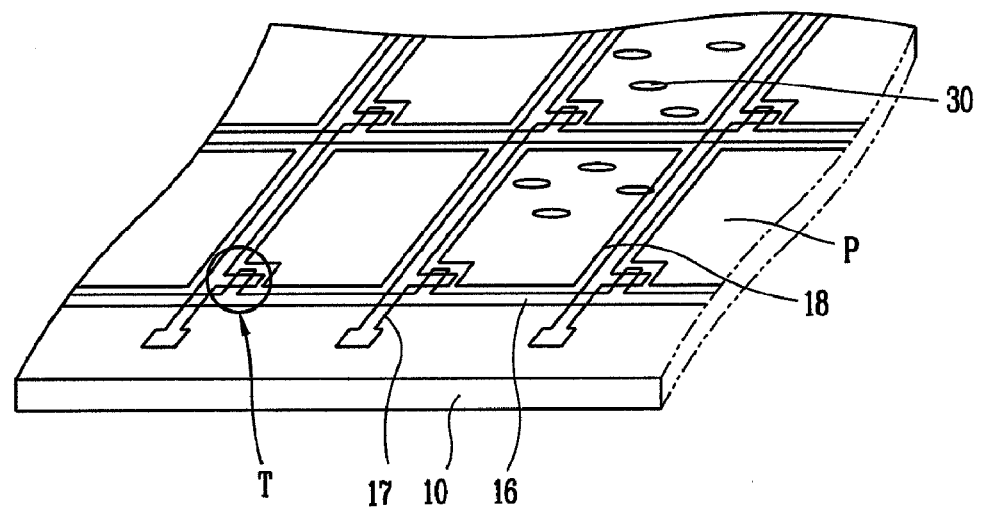

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

An LCD device and manufacturing and repairing methods thereof according to embodiments of the present disclosure will now be described in detail referring to the attached drawings.

Figure 2A:
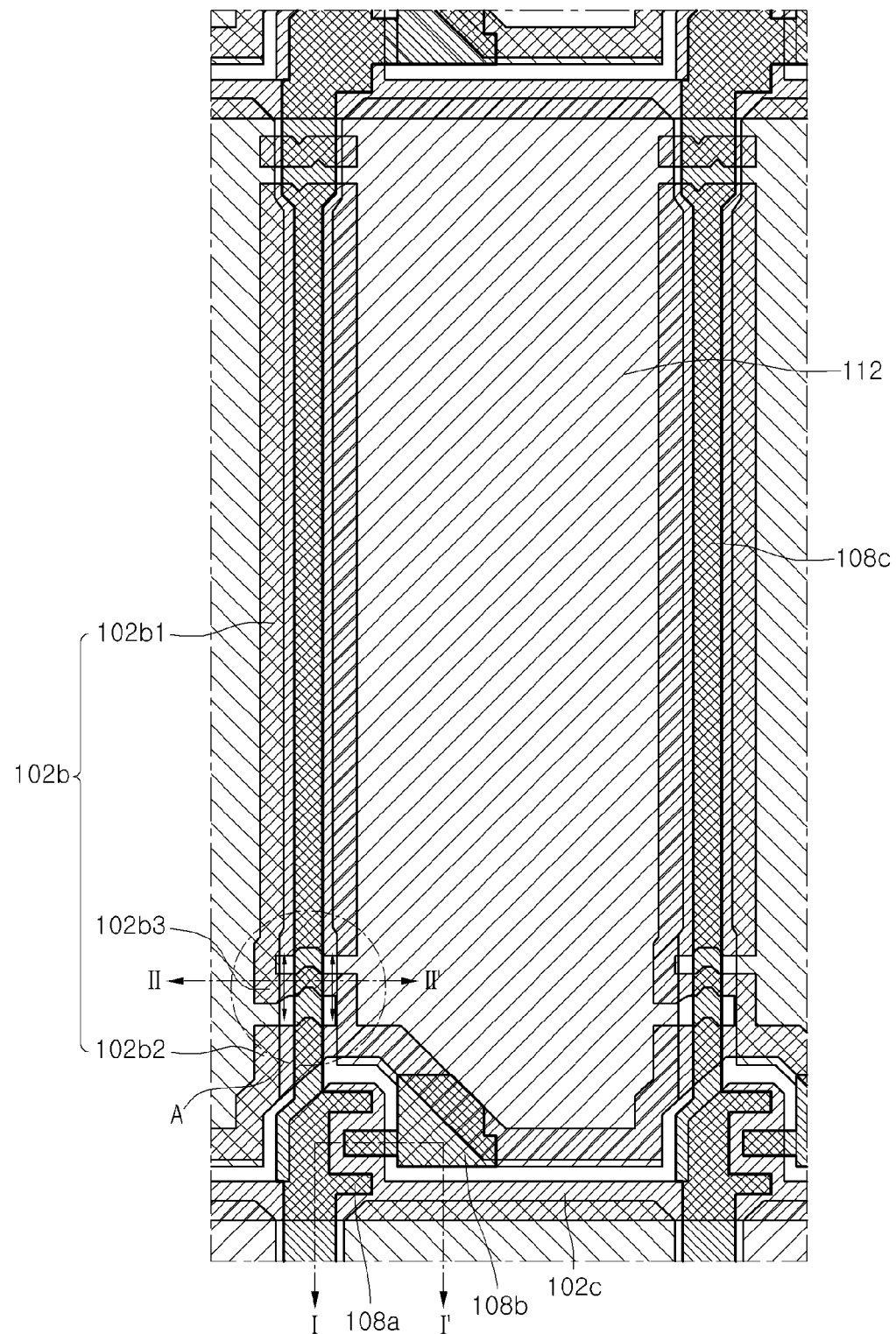
FIG. 2A is a planar view showing an LCD device with a repair pattern according to an embodiment of the present disclosure.
Figure 2B:
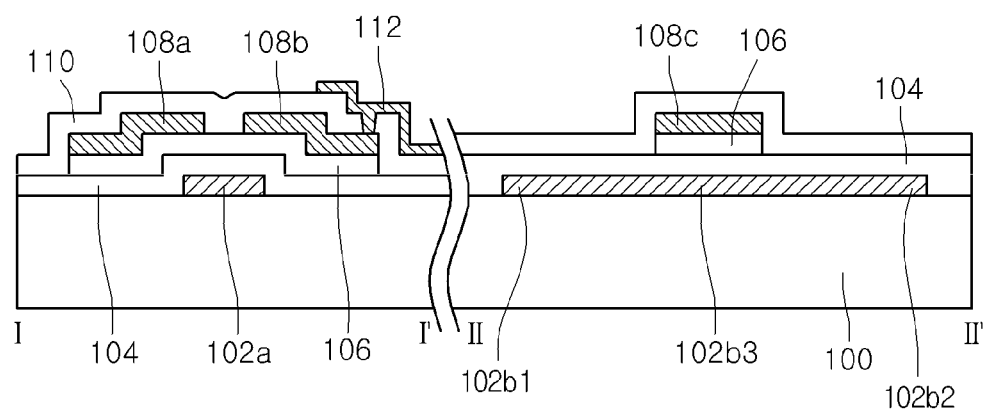
FIG. 2B is a cross-sectional view showing the LCD device taken along lines I-I' and II-II' in FIG. 2A.

FIG. 2A is a planar view showing an LCD device with a repair pattern according to an embodiment of the present disclosure. FIG. 2B is a cross-sectional view showing the LCD device taken along lines I-I' and II-II' in FIG. 2A. The LCD device includes a color filter substrate (not shown) and a thin film transistor substrate 100, which is shown in FIGS. 2A and 2B, opposite to each other in the center of a liquid crystal layer (not shown).

Although it is not shown in detail in the drawings, the color filter substrate includes a black matrix (not shown) formed opposite the boundary domain between pixel regions which are defined on the thin film transistor substrate 100. The color filter substrate further includes a color filter layer (not shown) formed between the black matrix, and a common electrode (not shown) formed on the black matrix and color filter layer.

The thin film transistor substrate 100 includes gate and data lines 102c and 108c formed to define the pixel regions, a gate electrode 102a formed to protrude from one side of each gate line 102c, and a gate insulation film 104 formed on the entire surface of the substrate 100 with the gate electrode 102a. The thin film transistor substrate 100 further includes a semiconductor pattern 106 formed in an island shape on the gate insulation film 104 opposite to the gate electrode 102a, a source electrode 108a formed to protrude from the data line 108c and to overlap with one edge of the upper surface of the semiconductor pattern 106, a drain electrode 108b separated by a first fixed distance from the source electrode 109a and formed to overlap the other edge of the upper surface of the semiconductor pattern 106. The thin film transistor substrate 100 still further includes a passivation (or protective) film 110 in which a contact hole is formed to expose the drain electrode 108b, and a pixel electrode 112 formed on the pixel region and configured to contact the drain electrode 108b through the contact hole.

Furthermore, the thin film transistor substrate 100 includes common lines 102b each formed under the data lines 108c, from the same material as the gate electrode 102a, and in the same layer as the gate electrode 102a. Each of the common line 102b includes first and second common line 102b1 and 102b2 separated by a second fixed distance from each other within a domain on which a part of the data line 108c (more specifically, a portion of the data line 108c adjacent to the source electrode 108a) is disposed, and a third common line 102b3 formed within a separated space between the first and second common lines 102b1 and 102b2 and used as a repair pattern.

The common lines 102b formed under the data lines 108c are used to screen light leakage domains which can be formed around the data lines 108c, thereby making it possible to reduce the width of the black matrix formed on the color filter substrate. As such, an aperture ration of the pixel region can become larger.

The third common line 102b3 used as a repair pattern is formed in a bar shape, which crosses with the data line 108c and has a longer length than the width of the data line 108c, in order to be connected to the first and second common lines 102b1 and 102b2. Also, both ends of the third common line 102b3 are exposed outwardly from both sides of the data line 108c.

Such a third common line 102b3 formed as a repair pattern can be cut off from the first and second common lines 102b1 and 102b2 by a laser beam irradiated to its both ends during a repairing process, when the common line 102b and the data line 108c are shortened to each other. In this case, a pixel region with the shortened circuit is insulated from other pixel regions adjacent to it. As such, only the shortened pixel region remains as a damaged pixel region. Therefore, the LCD device can prevent the pixel regions from being entirely damaged by a shortened circuit.

Subsequently, a method of manufacturing an LCD device with the above repair pattern will now be described in detail referring to FIGS. 3A, 3B, 4A, 4B, 5A, and 5B.

Figure 3A:
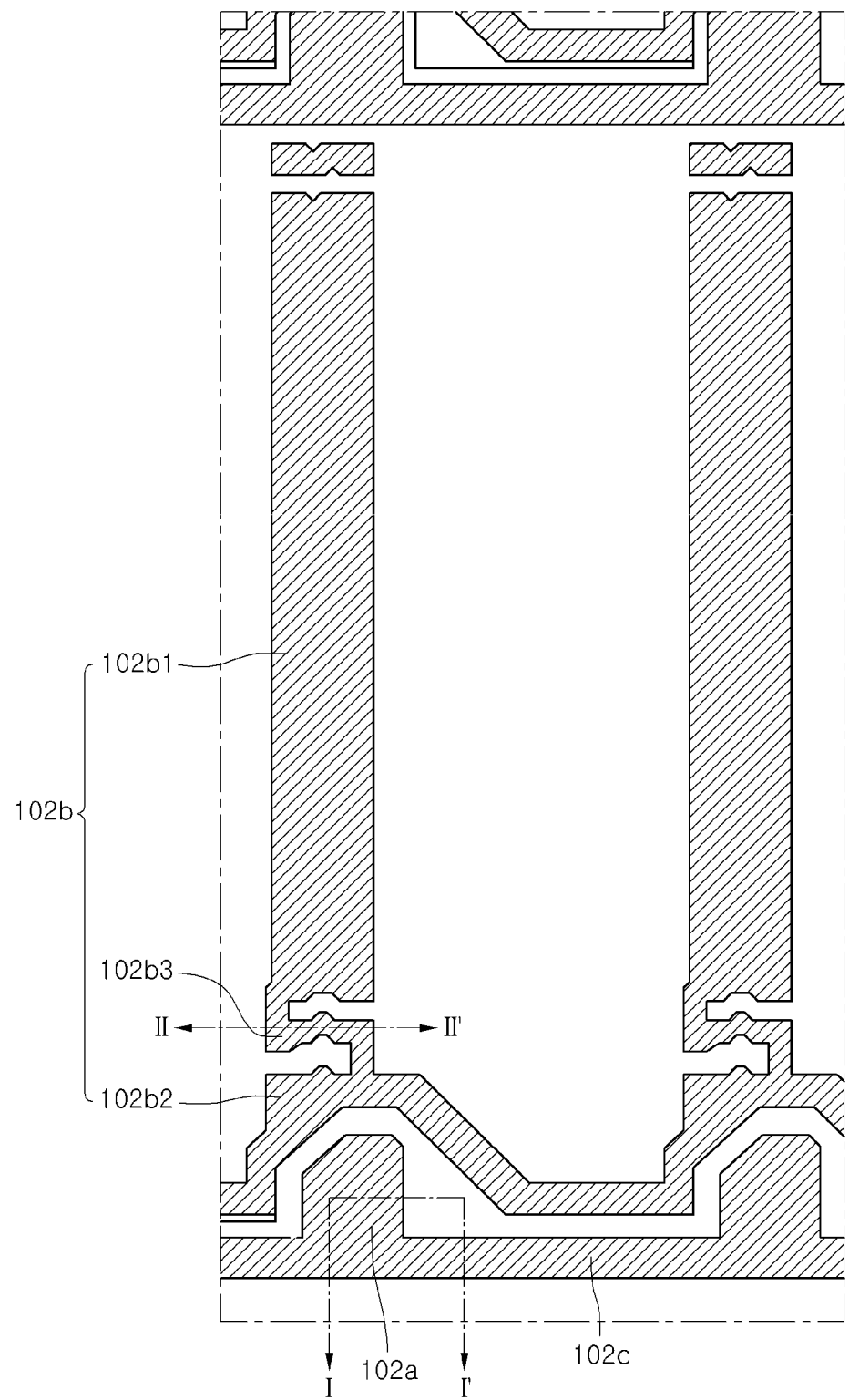
FIGS. 3A, 4A, and 5A are planar views sequentially illustrating a method of manufacturing an LCD device with a repair pattern according to an embodiment of the present disclosure.
Figure 3B:
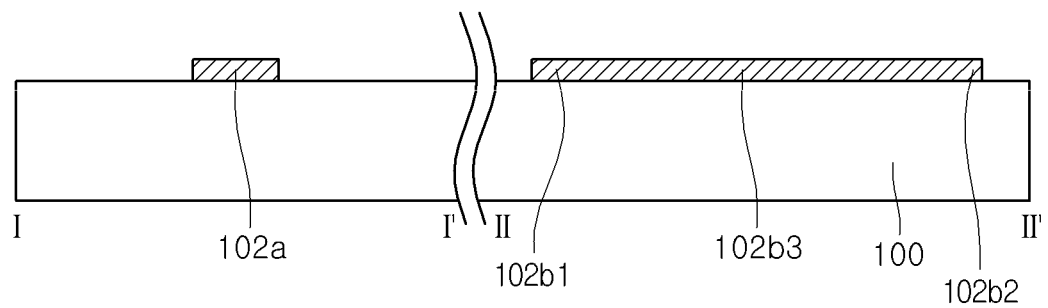
FIGS. 3B, 4B, and 5B are cross-sectional views showing the LCD device taken along lines I-I' and II-II' in each of FIGS. 3A, 4A, and 5A.

As shown in FIGS. 3A and 3B, a first conductive layer is deposited on the substrate 100 and then selectively patterned, thereby forming the gate lines 102c and the gate electrode 102a. When the first conductive layer is patterned, the common lines 102 configured to each include the first through third common lines 102b1 through 102b3 are simultaneously formed.

Figure 4A:
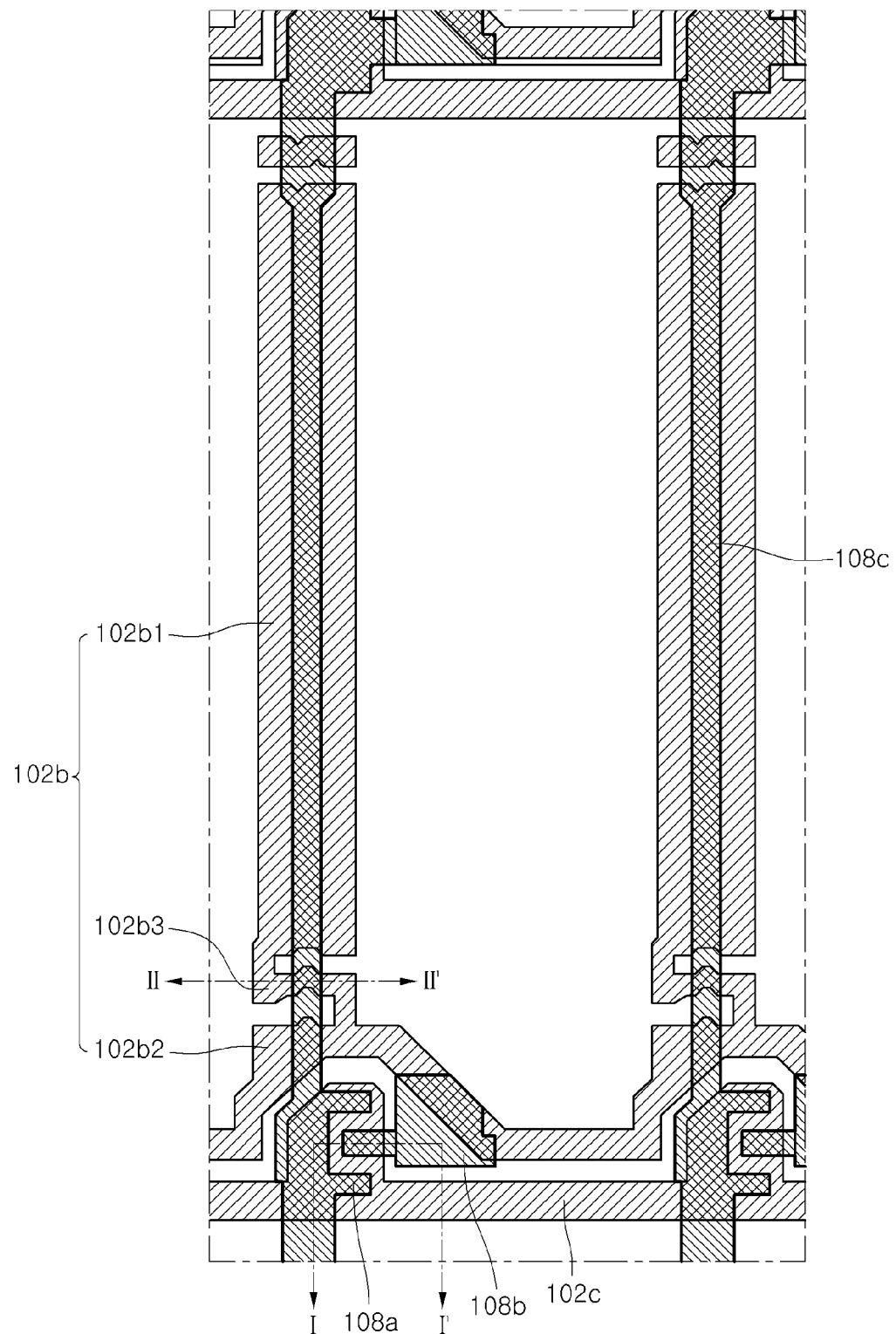
Figure 4B:
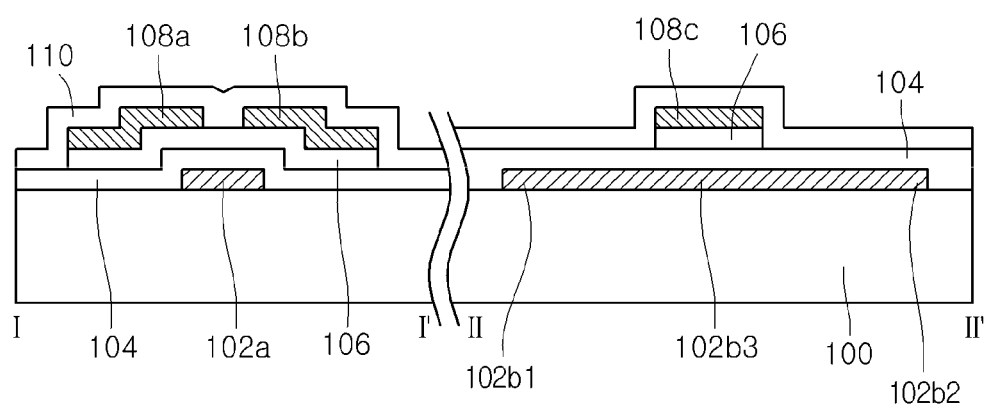
Figure 5A:
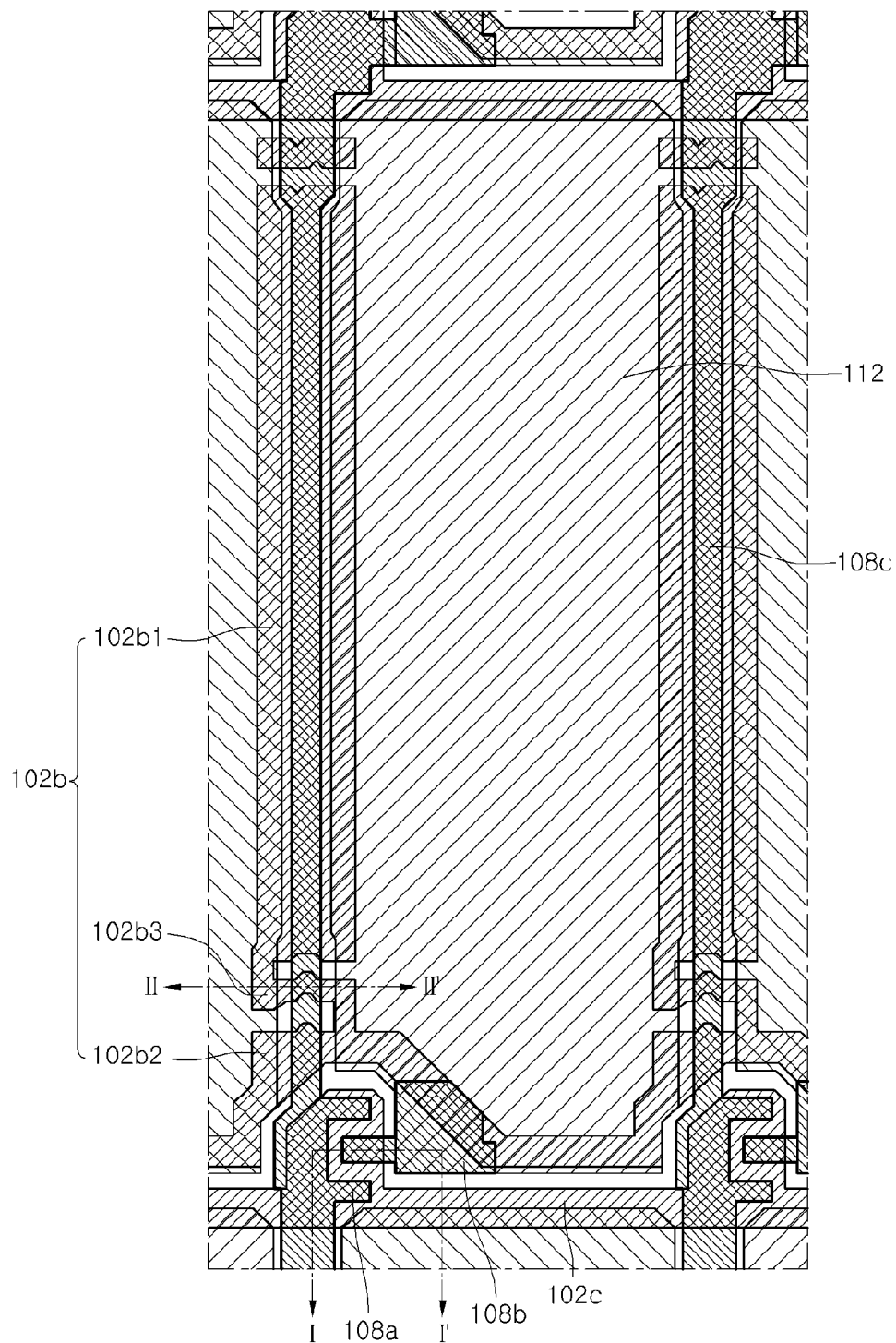
Figure 5B:
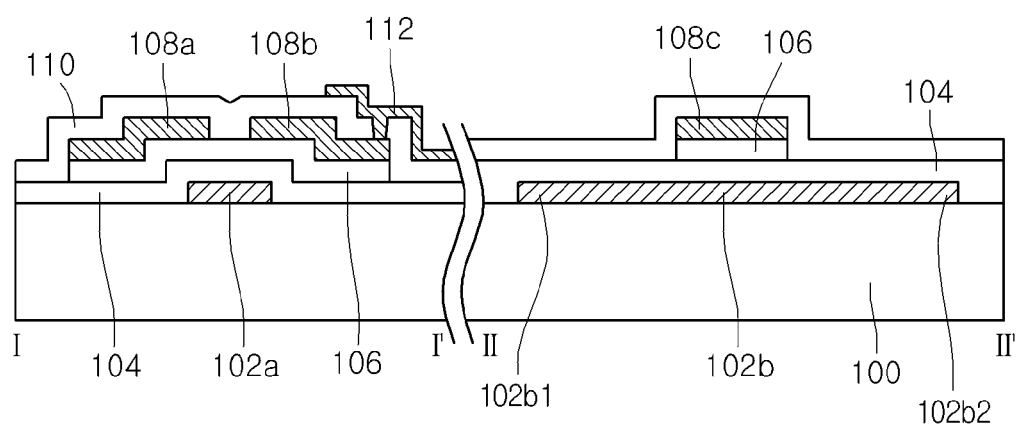

Thereafter, a gate insulation film 104 is formed on the substrate provided with the gate lines 102c, gate electrodes 102a, and common lines 102b, as shown in FIGS. 4A and 4B.

An amorphous silicon film, an impurity-doped amorphous silicon film, and a metal film are sequentially formed on the gate insulation film 104 and then patterned, so as to form source and drain electrodes 108a and 108b and a semiconductor pattern 106 configured to include stacked active and ohmic contact layers. The patterning of the amorphous silicon film, impurity-doped amorphous silicon film, and metal film can be performed by a first process of patterning the amorphous silicon film and impurity-doped amorphous silicon film and then a second process of patterning the metal film. Alternatively, the amorphous silicon film, impurity-doped amorphous silicon film, and metal film can be patterned through only one patterning process.

Next, a passivation film 110 is formed on the substrate 100 provided with the source and drain electrodes 108a and 108b and data line 108c. The passivation film 110 is selectively patterned to form a contact hole exposing the drain electrode 108b. Then, a transparent conductive film is formed on the substrate 100 with the contact hole. The transparent conductive film is patterned to form a pixel electrode 112 which is electrically connected to the drain electrode 108b.

Finally, a method of repairing an LCD device, as manufactured above, will now be described in detail referring to FIGS. 6A and 6B.

Figure 6A:
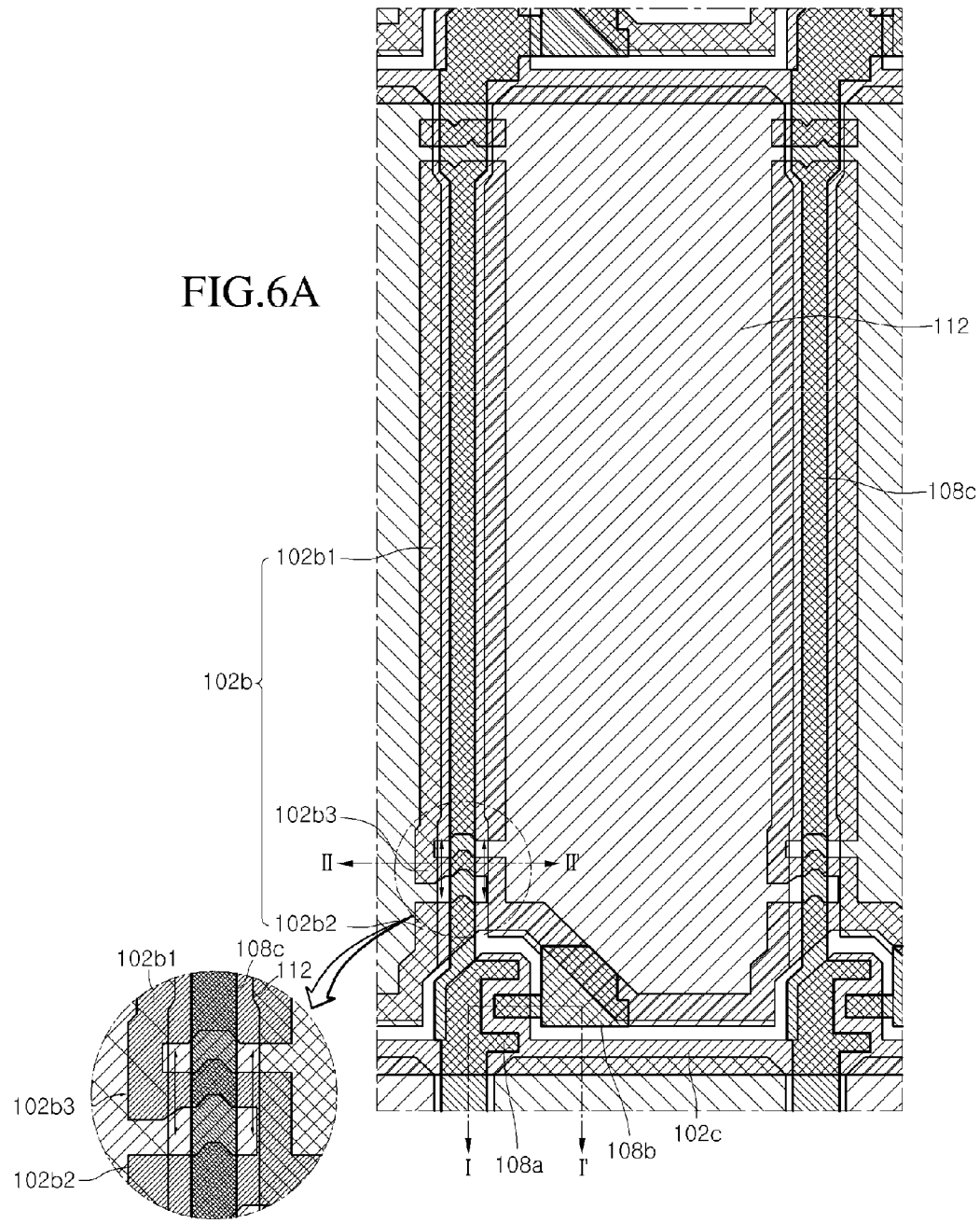
FIG. 6A is a planar view illustrating a method of repairing an LCD device according to an embodiment of the present disclosure.
Figure 6B:
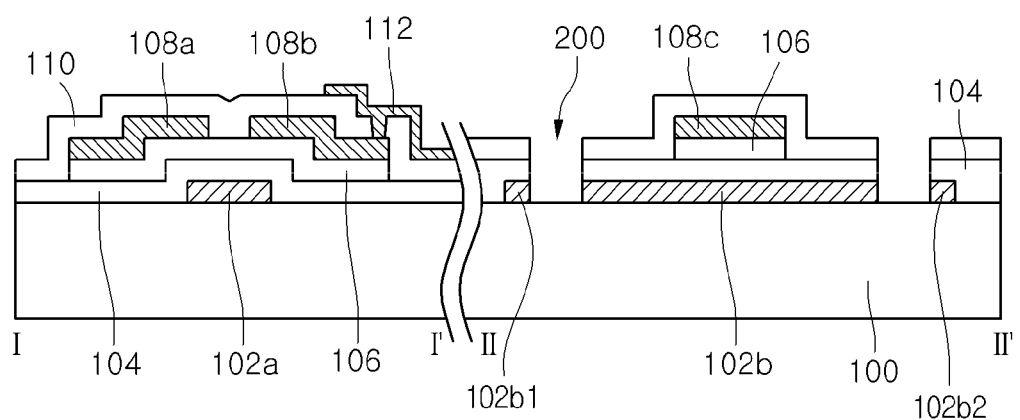
FIG. 6B is a cross-sectional view showing the LCD device taken along lines I-I' and II-II' in FIG. 6A.

If a data line 108c is shortened with a common line 102b, a repairing process can be performed which irradiates a laser beam 200 at both ends of the third common line 102b3 (along an arrow direction "↕" shown in FIG. 6A), as shown in FIGS. 6A and 6B. Then, the third common line 102b3 is cut off from the first and second common lines 102b1 and 102b2, as shown in FIG. 6B. In other words, both ends of the third common line 102b3 and parts of the gate insulation and passivation films opposite thereto are removed by irradiating the laser beam 200, so that the third common line 102b3 is cut off from the first and second common lines 102b1 and 102b3.

In this manner, as the third common line is cut off from the first and second common lines 102b1 and 102b2, the first common line 102b1 of a pixel region with a short circuit is electrically separated from the second common line 102b2 connected to the adjacent pixel regions. As a result, the LCD device of the present embodiment can prevent the residual pixel regions from being damaged by the pixel region with the shortened circuit, even though the pixel region with the shortened circuit remains as a damaged one.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A liquid crystal display device comprising:
a gate line and a gate electrode formed on a substrate;
a common line formed in the same layer as the gate line;
a gate insulation film entirely formed on the substrate with the gate line;
a data line formed on the gate insulation film opposite to the common line and configured to cross with the gate line and to define a pixel region;
a source electrode formed to protrude from the data line;
a drain electrode separated by a first distance from the source electrode;

a passivation film entirely formed on the substrate with the data line; and a pixel electrode formed on the passivation film and connected to the drain electrode, wherein the common line includes a first and a second common lines separated by a second distance from each other, and a third common line formed within the second distance between the first and the second common lines and used as a repair pattern during a repairing process, wherein the first common line is formed in a lengthwise direction of the data line, wherein the second common line is formed in a lengthwise direction of the gate line, wherein the first common line is formed under and extends along the data line to screen a plurality of light leakage domains, and wherein the third common line is formed in a bar shape, which is configured to cross with the data line, and connected to the first and second common lines.

2. The liquid crystal display device of claim 1, wherein the common line is formed in a width wider than that of the data line and exposed outwardly from both sides of the data line.

3. A method of manufacturing a liquid crystal display device, the method comprising:

forming a gate line, a gate electrode, and a first through third common lines on a substrate;

forming a gate insulation film on an entire surface of the substrate loaded with the gate line;

forming a semiconductor pattern, a source/drain electrodes, and a data line on the gate insulation film;

forming a passivation film on the substrate loaded with the source/drain electrodes;

patterning the passivation film to form a contact hole exposing the drain electrode; and forming a pixel electrode, which is electrically connected to the drain electrode, on the passivation film, wherein the first and the second common lines are formed in such a manner as to be separated by a second distance from each other, and the third common line is formed within an interval between the first and the second common lines, as a repair pattern to be used during a repairing process, wherein the first common line is formed in a lengthwise direction of the data line, wherein the second common line is formed in a lengthwise direction of the gate line, wherein the first common line is formed under and extends along the data line to screen a plurality of light leakage domains, and wherein the third common line is formed in a bar shape, which is configured to cross with the data line, and connected to the first and second common lines.

4. The method of claim 3, wherein the common line is formed in a width wider than that of the data line and exposed outwardly from both sides of the data line.

5. A method of repairing a liquid crystal display device, the liquid crystal display device including:

a gate line, and a gate electrode formed on a substrate;

a common line formed in the same layer as the gate line and configured to include first and second common lines, which are separated by a second distance from each other, and a third common line which is formed within the second distance between the first and second common lines and used as a repair pattern during a repairing process;

a gate insulation film entirely formed on the substrate with the gate line;

a data line formed on the gate insulation film opposite to the common line and configured to cross with the gate line and to define a pixel region;

a source electrode formed to protrude from the data line;

a drain electrode separated by a first distance from the source electrode;

a passivation film entirely formed on the substrate with the data line; and a pixel electrode formed on the passivation film and connected to the drain electrode, the method comprising irradiating a laser beam at a stacked gate insulation and passivation films opposite to both ends of the third common line to cut off the third common line from the first and the second common lines, wherein the first common line is formed in a lengthwise direction of the data line, wherein the second common line is formed in a lengthwise direction of the gate line, and wherein the first common line is formed under and extends along the data line to screen a plurality of light leakage domains.

* * * * *